United States Patent [19]
Beurrier

[11] 3,786,361
[45] Jan. 15, 1974

[54] BROADBAND AMPLIFIER

[75] Inventor: Henry Richard Beurrier, Chester Township, Morris County, N.J.

[73] Assignee: Bell Telephone Laboratories, Incorporated, Murray Hill, Berkeley Heights, N.J.

[22] Filed: Sept. 18, 1972

[21] Appl. No.: 289,822

[52] U.S. Cl. ........................ 330/20, 330/17, 330/19, 330/21, 330/22
[51] Int. Cl. .............................................. H03f 3/68
[58] Field of Search .................. 330/13, 19, 20, 21, 330/22, 31, 32, 17; 307/303

[56] References Cited
UNITED STATES PATENTS

| | | | |
|---|---|---|---|
| 2,848,564 | 8/1958 | Keonjian | 330/19 X |
| 3,381,234 | 4/1968 | Zane | 330/13 |
| 3,471,793 | 10/1969 | Miwa et al. | 330/31 X |

*Primary Examiner*—Herman Karl Saalbach
*Assistant Examiner*—Lawrence J. Dahl
*Attorney*—S. Sherman

[57] ABSTRACT

The band-limiting effects of parasitics are minimized in a two-stage amplifier wherein the active elements are operated in the common collector and the common base configurations. A pair of impedances $Z_1$ and $Z_2$ connect the emitter of one of the transistors to the emitter and the collector, respectively, of the other transistor. The collector of the latter transistor serves as the amplifier output terminal. Operating into a high impedance output load, the gain of the amplifier is given by $(Z_2/Z_1 + 1)$.

4 Claims, 5 Drawing Figures

BROADBAND AMPLIFIER

BACKGROUND OF THE INVENTION

This application relates to broadband amplifiers.

The bandwidth of an amplifier is typically limited by the spurious reactances associated with the circuit components and, in particular, with the active element. Various compensating techniques have been devised for neutralizing these reactances but such techniques themselves tend to be band-limiting and often introduce instabilities out of the band of interest. Furthermore, they usually include the use of inductors which are not readily integrable.

It is, accordingly, the object of the present invention to provide broadband stable amplification by means of simple, fully integrable circuits.

SUMMARY OF THE INVENTION

In accordance with the present invention, broadband amplification is realized by operating the active elements in a highly degenerative mode, and by embedding the active elements in a very low impedance environment.

In a first embodiment of the invention, two active elements, such as transistors, are used. The first is connected in the grounded collector configuration. The second is operated in the grounded base configuration. A pair of impedances of magnitudes $Z_1$ and $Z_2$ connect the emitter of the first element to the emitter and collector, respectively, of the second element. An input signal connected to the base of the first transistor will realize 20 log $(Z_2/Z_1 + 1)$ dB of voltage gain across a high impedance output load connected to the collector of the second transistor.

Since, to a first order approximation, the first transistor draws no current, it is omitted in a second embodiment of the invention, and the input signal connected directly to the pair of impedance.

It is an advantage of the invention that only resistors and capacitors need be used with the active elements and, hence, the circuit is fully integrable.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
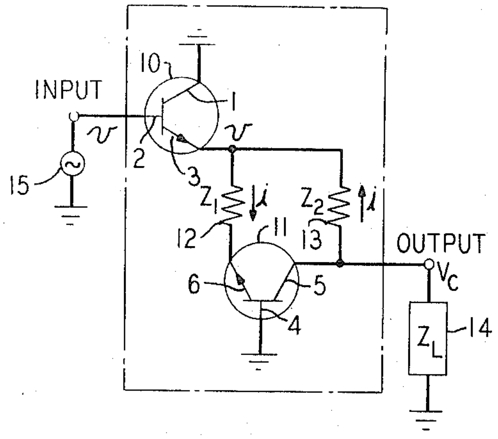
FIG. 1 shows a first embodiment of an amplifier in accordance with the present invention, including two transistor and two impedances.

Referring to the drawings, FIG. 1 shows a first embodiment of an amplifier, in accordance with the present invention, comprising first and second transistors 10 and 11, connected by means of a pair of impedances 12 and 13. The input stage transistor 10 is connected in the common collector configuration wherein the collector electrode 1 is grounded with respect to the signal. The base electrode 2 is the amplifier input terminal while the emitter 3 is the stage output terminal. The latter is connected by means of two impedances 12 and 13 to transistor 11, which constitutes the output stage of the amplifier, and is connected in the common base configuration. As such, the base electrode is grounded with respect to the signal. The emitter electrode 6 is connected to the emitter electrode 3 of transistor 10 by means of impedance 12, while the collector electrode 5 is connected to emitter electrode 3 by means of the other impedance 13. Collector electrode 5, which is also the output terminal of the amplifier, is connected to an output load 14.

For reasons which will become apparent hereinbelow the magnitude $Z_1$ of impedance 12 is selected such that it is much larger, preferably an order of magnitude larger than the emitter impedance of transistors 10 and 11. The magnitude $Z_2$ of impedance 13, is selected such that it is much smaller, preferably an order of magnitude smaller than the output load impedance $Z_L$. The latter is typically very large, being comparable to the collector impedance of output transistor 11. Hence, the impedance of the signal path from the emitter of transistor 10 to ground, through impedance 13, is very high compared to the impedance to ground of the parallel signal path from emitter 3 through impedance 12 which is essentially defined by the magnitude of impedance 12.

In operation, a signal, derived from a signal source 15, produces a voltage $v$ at the base of input transistor 10. This, in turn, produces a substantially equal voltage $v$ at emitter 3. For the reasons given above, voltage $v$ produces a current $$i = V/Z_1 , \quad (1)$$

which flows through impedance 12 and into the emitter of transistor 11. This, in turn, produces a collector current $i$, essentially all of which flows into impedance 13. The resulting collector voltage $V_c$, impressed across the output load 14, is equal to the voltage drop across impedance 13, plus the voltage at emitter 3, or $$V_c = iZ_2 + v . \quad 2$$

Substituting for $i$ from equation 1 and collecting terms, we obtain $$V_c = v(Z_2/Z_1 + 1) . \quad 3$$

The net voltage gain G of the amplifier is therefore, $$G = (Z_2/Z_1 + 1) . \quad 4$$

For the special case where Z equals $Z_2$, G=2, or 6dB.

It will be noted that both transistors are operated in highly degenerative modes. In addition, both $Z_1$ and $Z_2$ can be of the order of 50 ohms and still satisfy the conditions set forth hereinabove. Since both these conditions, i.e., operation of the active elements in degenerative modes, and embedding them in a low impedance environment, tend to minimize the deleterious effects of spurious reactances, the overall result is to maximize the useful frequency band over which the transistors can provide constant, stable gain.

It will also be noted that to a first order approximation the net emitter current for transistor 10 is zero. This being the case, for some applications transistor 10 can be omitted, resulting in the simplified circuit of FIG. 2.

Figure 2:
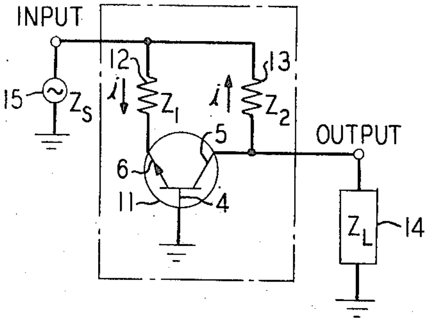
FIG. 2 shows a simplified emodiment of the invention using only one transistor.

Using the same identification numeral as in FIG. 1 to identify corresponding elements, the amplifier in FIG. 2 comprising a single transitor 11 whose emitter 6 and whose collector 5 are connected directly to the amplifier input terminal by means of impedances 12 and 13, respectfully. Output load 14 is connected to collector 5, while base 4 is grounded. Since the emitter current is essentially equal to the transistor collector current, substantially all of which flows through impedance 13, and since these two currents are 180° out of phase, as seen by the input source, the net current supplied by source 15 is zero. Hence, the source sees an open circuit at the amplifier input terminal, which is the same as in the embodiment of FIG. 1. The output impedance $Z_o$ of the amplifier of FIG. 2 is given by $$Z_o = Z_s + Z_2 + (Z_s Z_2 / Z_1) \ ,$$

5 where $Z_s$ is the signal source impedance. The output impedance of the amplifier shown in FIG. 1 is equal to $Z_2$.

Figure 3:
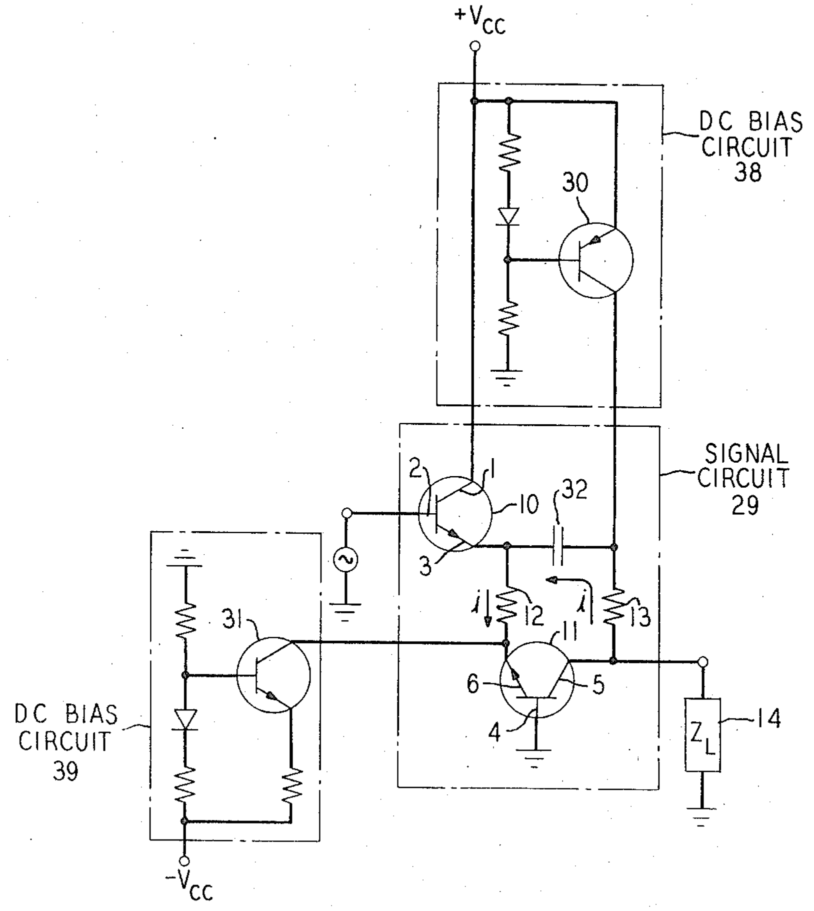
FIGS. 3, 4, and 5 show various modifications of the invention relative to the direct current bias circuits.

In the above discussion only the signal portion of the amplifier was considered. However, the transistors must be provided with direct current bias. When the latter portion of the circuit is included, a number of practical decisions must be made which have a bearing upon the operation of the amplifier. To illustrate, we now consider the circuit shown in FIG. 3 which includes both the signal circuit portion 29 of the amplifier and the direct current biasing circuits 38 and 39. Using the same identification numerals for corresponding components, the signal circuit 29 comprises transistors 10 and 11, and interconnecting impedances 12 and 13. This portion of the circuit differs from that shown in FIG. 1 only by the inclusion of a large coupling capacitor 32 between impedance 13 and the emitter of transistor 10.

Direct current bias is supplied by circuits 38 and 39, each of which includes a transistor and associated resistors and diodes. Because of the high output impedance provided by transistors 30 and 31 of the respective bias circuits, they have essentially no effect upon the operation of the amplifier and the description given hereinabove in connection with FIG. 1 applies equally. However, this circuit includes two additional transistors, and requires the use of both *n-p-n* and *p-n-p* transistor types. The circuit, however, is fully integrable.

Figure 4:
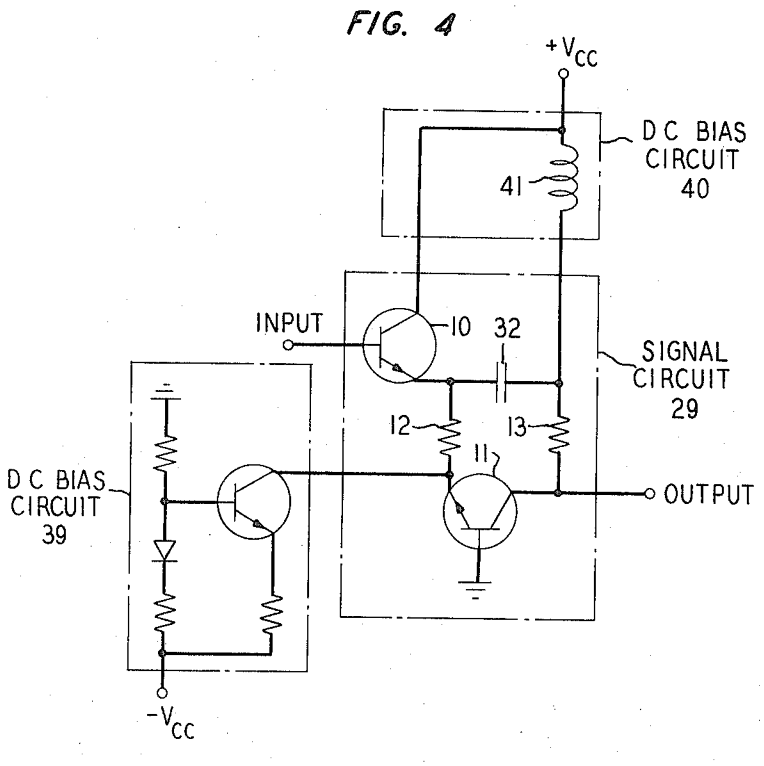

A somewhat simplified circuit is illustrated in FIG. 4. The latter includes, as in FIG. 3, signal circuit 29, and *d-c* bias circuit 39. However, *d-c* bias circuit 38 is replaced by *d-c* bias circuit 40 which comprises solely a signal frequency choke 41. So long as the impedance of choke 41 is much larger than the impedance of blocking capacitor 32, the overall operation of the amplifier is substantially the same as that of FIGS. 1 and 3.

While this circuit has the advantage of requiring one less transistor, and while it can implement with transistors of the same type, it has the disadvantage of requiring an inductor.

Figure 5:
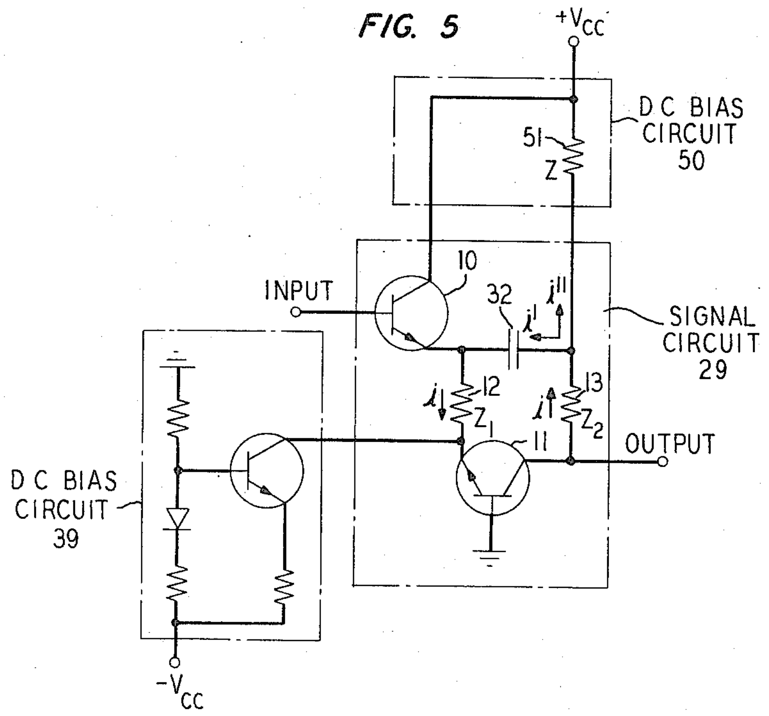

FIG. 5, now to be considered, avoids the use of an inductor by replacing it with a resistor. Thus, the embodiment of FIG. 5 includes the signal circuit 29 and the *d-c* bias circuit 39, described above, and a *d-c* bias circuit 50 comprising a resistor 51 which connects the direct current source $+V_{cc}$ to the junction of impedance 13 and blocking capacitor 32.

Whereas the impedance of choke 41 at the frequency of the signal was much greater than its *d-c* impedance, this is not the case for resistor 51. Typically, the *d-c* impedance of resistor 51 will be approximately the same as its signal frequency impedance Z. Inasmuch as its *d-c* impedance cannot be made arbitrarily large without unduly increasing the *d-c* source voltage $+Z_{cc}$ needed, it may tend to have a shunting effect upon the signal circuit. For example, for the particular case where the impedance of coupling capacitor 32 is equal to the impedance of resistor 51, the signal current *i* in impedance 13 will divide equally between them. As a result, translator 10 will be required to draw some signal current. While this requires that transistor 10 have sufficient current handling capacity to accommodate the signal current that flows through resistor 51, the fact that the current distribution can be altered provides an added degree of flexibility to the circuit. For example, the capacitance of the coupling capacitor 32 and the magnitude of resistor 51 can be specifically selected so that the capacitor has a much higher impedance than resistor 51 at the lower end of the frequency band of interest, but a much smaller impedance than resistor 51 at the higher end of the band. Assuming further that $Z = Z_2$, the output impedance of the amplifier at the lower frequencies will be approximately $Z + Z_2 = 2Z_2$. However, it will only be $Z_2$ at the higher end of the band due to the shunting effect of capacitor 32. This reduction in output impedance which, incidentally, occurs without any change in the over gain, is desirable as it tends to minimize the shunting effects of any spurious reactances present in the circuit. The net effect of this is to maintain a more constant gain over a broader band of frequencies. In addition by using this technique, a much small smaller blocking capacitor can be used. This has the further advantage of being more readily realized using integrated circuit techniques.

It is a further advantage of the invention that the gain, as given by equation 4, is a function of the ratio of $Z_1$ and $Z_2$ and is not dependent on their absolute magnitudes. This further eases the manufacturing tolerances required in the fabrication of integrated circuit amplifiers of the type described hereinabove.

It will be recognized that the particular transistor types shown hereinabove, and the specific direct current bias circuits shown are merely illustrative. Thus, it is recognized that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. An amplifier comprising:

- a first transistor connected in the common collector configuration;
- a second transistor connected in the common base configuration;
- a first impedance connected between the emitter of said first transistor and the emitter of said second transistor;
- a second impedance connected between the emitter of said first transistor and the collector of said second transistor;
- the base of said first transistor being the input terminal of said amplifier;
- and an output load having an impedance that is larger than the magnitude of said second impedance connected to the collector of said second transistor.

2. The amplifier according to claim 1 wherein the impedance of the output load is at least ten times the magnitude of said second impedance and wherein the gain of said amplifier is given by $$G = (Z_2/Z_1 = 1),$$

where $Z_1$ and $Z_2$ are the respective magnitudes of said first and second impedances.

3. The amplifier according to claim 1 including a blocking capacitor in series between the emitter of said first transistor and said second impedance.

4. An amplifier comprising:

- a transistor connected in the common base configuration;
- first and second impedances connected between the input terminal of said amplifier and the emitter and collector, respectively, of said transistor;
- and an output load having an impedance that is at least an order of magnitude larger than that of said second impedance connected to the collector of said transistor.

* * * * *